(12) United States Patent
Houbre et al.

(10) Patent No.: US 10,823,763 B2
(45) Date of Patent: Nov. 3, 2020

(54) DEVICE FOR MEASURING ELECTRIC CURRENTS

(71) Applicant: Schneider Electric Industries SAS, Rueil Malmaison (FR)

(72) Inventors: Pascal Houbre, Jarrie (FR); Sebastien Buffat, Tullins (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 86 days.

(21) Appl. No.: 16/090,465

(22) PCT Filed: Apr. 7, 2017

(86) PCT No.: PCT/EP2017/058423
§ 371 (c)(1),
(2) Date: Oct. 1, 2018

(87) PCT Pub. No.: WO2017/178378
PCT Pub. Date: Oct. 19, 2017

(65) Prior Publication Data
US 2019/0079116 A1    Mar. 14, 2019

(30) Foreign Application Priority Data

Apr. 11, 2016  (FR) ...................................... 16 53163

(51) Int. Cl.
| | | |
|---|---|---|
| *G01R 15/18* | (2006.01) | |
| *G01R 19/00* | (2006.01) | |
| *H01F 38/38* | (2006.01) | |

(52) U.S. Cl.
CPC ....... *G01R 15/181* (2013.01); *G01R 19/0092* (2013.01); *H01F 38/38* (2013.01)

(58) Field of Classification Search
CPC ........... G06K 7/10465; G06K 7/10356; G06K 7/10336; G06K 7/10346; G01N 27/72
(Continued)

(56) References Cited

U.S. PATENT DOCUMENTS 3,566,143 A  *  2/1971  Paine .......................... H02J 7/34
                                                      307/126
3,609,522 A  *  9/1971  Hutchins ................ G01V 3/105
                                                      324/334
(Continued)

FOREIGN PATENT DOCUMENTS

| DE | 197 31 170 A1 | 1/1999 |
|---|---|---|
| WO | WO 2013/001298 A1 | 1/2013 |

OTHER PUBLICATIONS

International Search Report dated Jul, 14. 2017, In PCT/EP2017/058423 filed Apr. 7, 2017.

*Primary Examiner* — Giovanni Astacio-Oquendo
(74) *Attorney, Agent, or Firm* — Oblon, McClelland, Maier & Neustadt, L.L.P.

(57) ABSTRACT

A device for measuring electric currents includes Rogowski-type current sensors, each configured to measure an AC electric current in an electrical conductor, each sensor including coils that are electrically connected in series to form a measurement circuit and being joined to one another to delimit a central zone of this sensor to receive the corresponding electrical conductor. One of the coils is common to the first and second sensors, this common coil being electrically connected to the first and second measurement circuits.

10 Claims, 4 Drawing Sheets

(58) Field of Classification Search
USPC .................. 324/200, 207.3, 244, 253, 254
See application file for complete search history.

(56) References Cited

U.S. PATENT DOCUMENTS

| | | | | |
|---|---|---|---|---|
| 3,629,694 | A * | 12/1971 | Hearn | G01R 33/26 |
| | | | | 324/304 |
| 6,313,727 | B1 | 11/2001 | Gabriel | |
| 2013/0193987 | A1 | 8/2013 | Kesler et al. | |
| 2014/0125321 | A1 | 5/2014 | Dames et al. | |
| 2015/0362570 | A1* | 12/2015 | Sakakura | A61B 5/055 |
| | | | | 324/319 |
| 2016/0025830 | A1* | 1/2016 | Roland | A61B 5/4312 |
| | | | | 324/309 |
| 2016/0089029 | A1* | 3/2016 | Biber | A61B 5/004 |
| | | | | 600/422 |

* cited by examiner

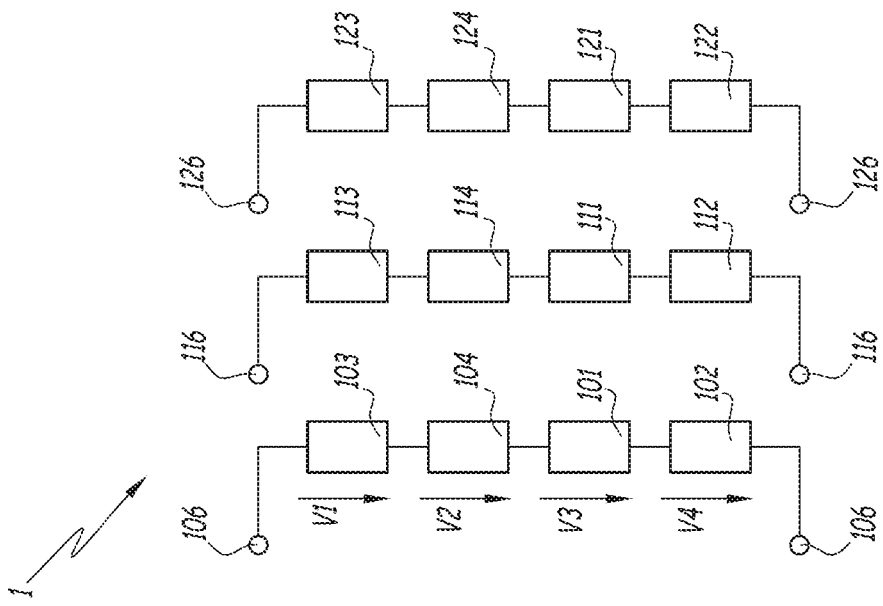
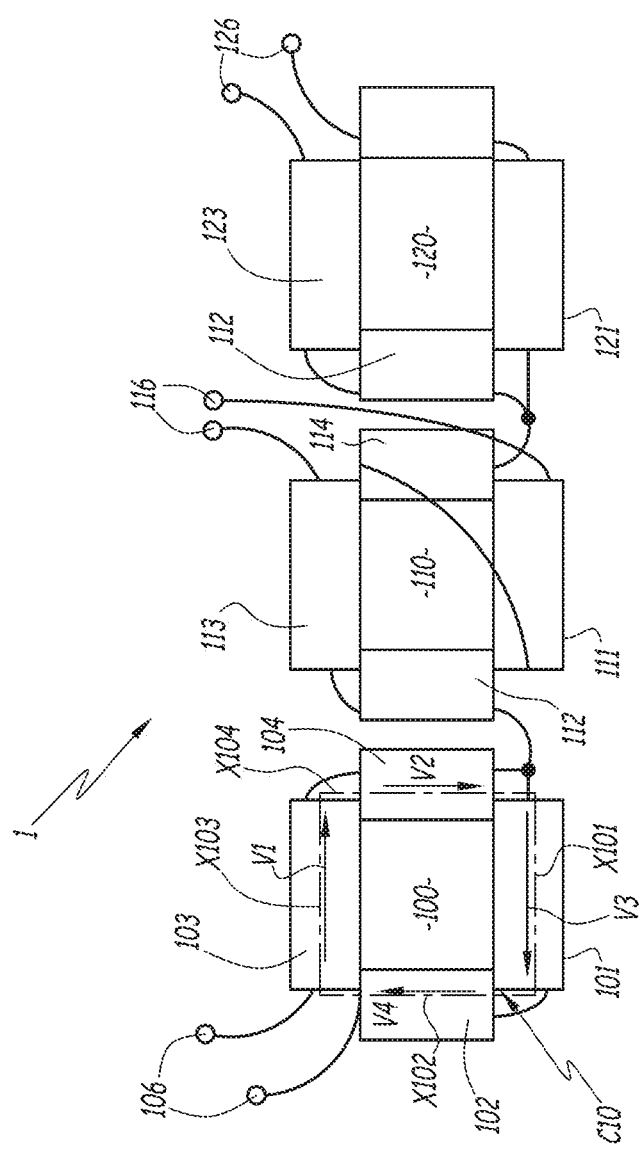
Fig.2
Fig.1
(Prior Art)

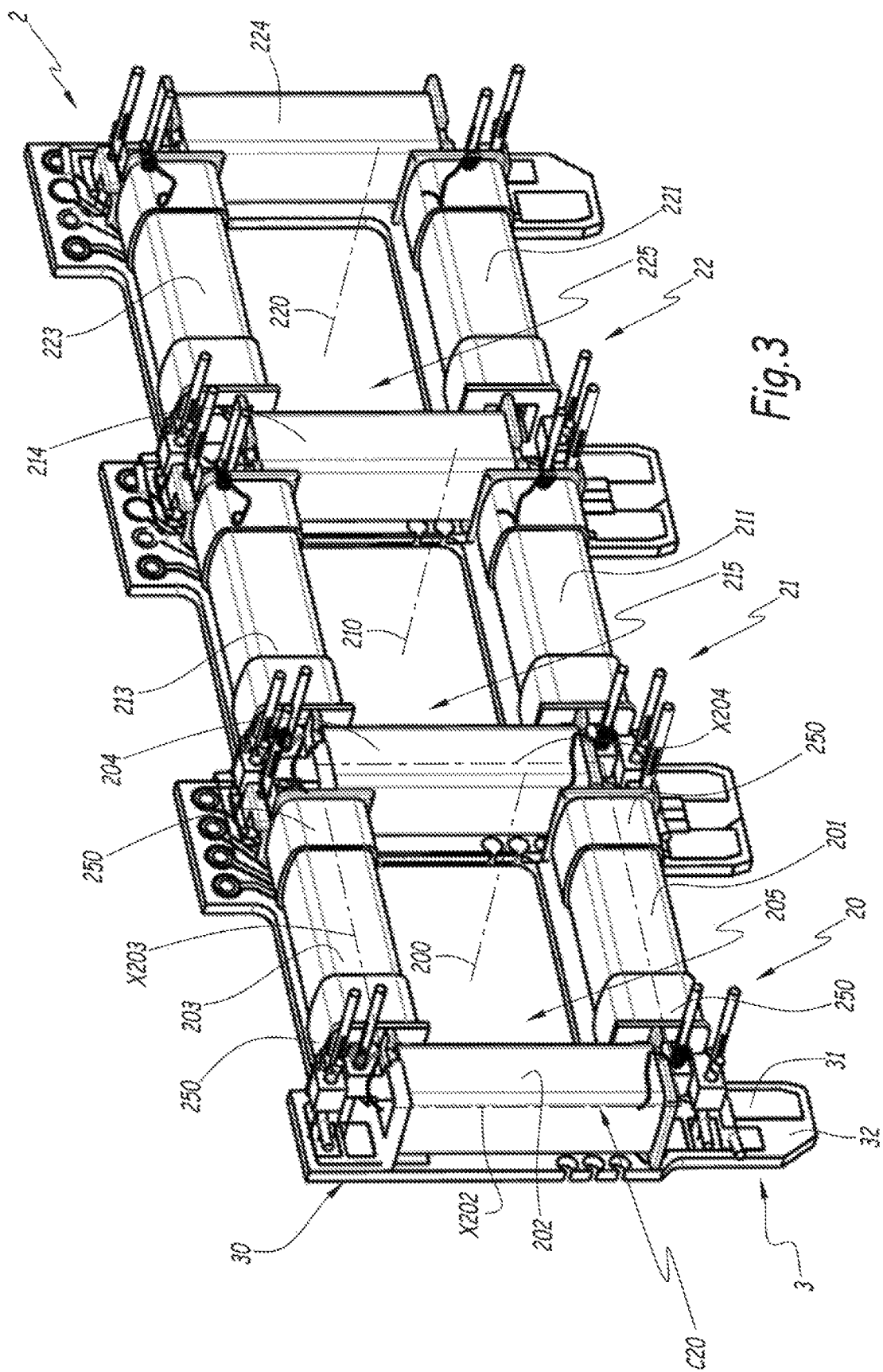

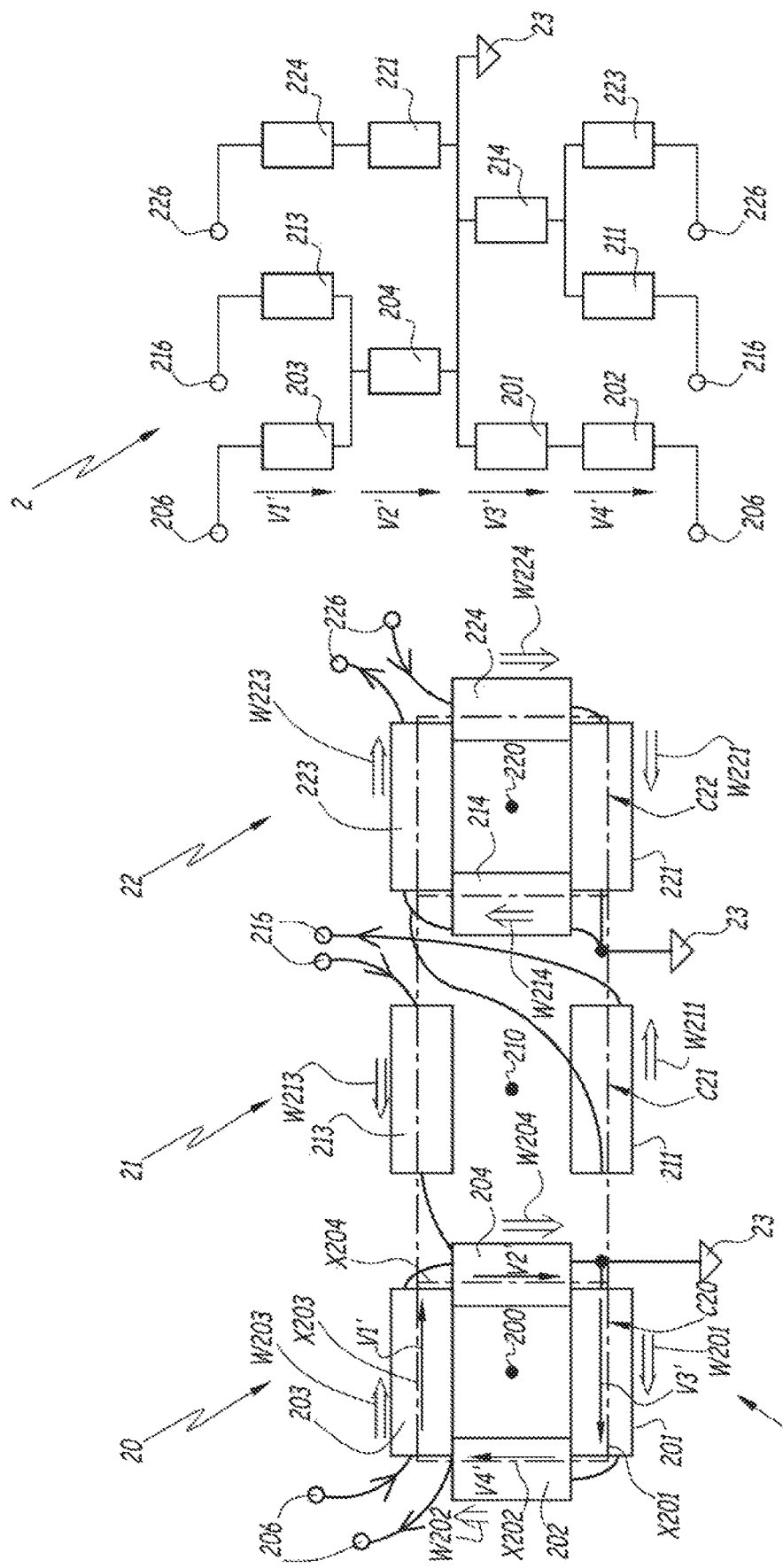

DEVICE FOR MEASURING ELECTRIC CURRENTS

The invention relates to a device for measuring electric currents flowing through electrical conductors.

Inductive electric current sensors, referred to as Rogowski sensors, that are intended to be placed around an electrical conductor, such as a cable or an electrical line, through which an AC electric current to be measured flows, are known. Such a sensor typically includes a solenoid, which is positioned around the electrical conductor. The current flowing through the electrical conductor generates a magnetic field, which in turn generates, across the terminals of this winding, a difference in electrical potential that is proportional to the intensity of the electric current. The intensity value of the latter is then determined on the basis of the measured difference in potential.

EP 1 596 206 A1 describes such a current sensor, referred to as a Rogowski current sensor, in which the solenoid is obtained by assembling a plurality of distinct coils around the electrical conductor and electrically connecting them to one another in series in order to form a measurement circuit. These coils are for example pre-wound coils that are identical to one another, thereby making it possible to optimize the industrial-scale production of the sensor on the basis of standardized components.

One drawback of this known sensor is that its performance is not entirely satisfactory when it comes to measuring currents flowing through a plurality of electrical conductors, for example within a polyphase electrical system. Specifically, it is necessary to use a sensor for each electrical conductor. The juxtaposition of these sensors results in a substantial bulk, which is proportional to the number of electrical conductors that are to be subjected to measurement, and which is not acceptable in certain applications, in particular when the electrical conductors are close to one another.

The devices described in the following documents are also known from DE-19731170-A1, WO-2013/001298-A1 and US-2013/0193987-A1 and exhibit similar drawbacks.

It is these drawbacks that the invention particularly intends to address, by providing a current measurement device including Rogowski-type current sensors for an electrical system including a plurality of electrical conductors, it being possible to produce this device with a simplified construction and with decreased bulk.

To this end, the invention relates to a device for measuring electric currents, comprising first and second Rogowski-type current sensors, each capable of measuring an AC electric current in first and second electrical conductors, each of the first and second sensors including coils that are electrically connected in series in order to form first and second measurement circuits, respectively, each coil extending along a longitudinal axis, the coils of one and the same sensor being joined to one another so as to delimit a central zone of this sensor in order to receive the corresponding electrical conductor, the longitudinal axes of the coils of one and the same sensor forming a closed polygonal outline surrounding this central zone of this sensor, wherein one of the coils is common to the first and second sensors, this coil being electrically connected to the first and second measurement circuits, the longitudinal axis of this coil belonging to the first and second polygonal outlines.

By virtue of the invention, because one of the coils is common to the first and second sensors, the bulk of the measurement device is decreased, since it includes one coil fewer with respect to the case in which known sensors are juxtaposed side by side. The cost of producing such a measurement device is also decreased, since it requires one fewer coil. Lastly, the inventors have determined that such an arrangement of the coils makes it possible to obtain a measurement of the current exhibiting a level of reliability and of accuracy that is analogous and sufficient with respect to the use of two distinct known sensors in juxtaposition.

According to some advantageous but non-mandatory aspects of the invention, such a measurement device may incorporate one or more of the following features, in any technically permissible combination:

The device further includes a third Rogowski-type current sensor capable of measuring an electric current in a third electrical conductor, this third sensor including coils that are electrically connected in series in order to form a fourth measurement circuit, these coils being joined to one another so as to delimit a central zone of the third sensor in order to receive the third electrical conductor, the respective longitudinal axes of these coils forming a third closed polygonal outline that surrounds the central zone of this sensor, one of the coils is common to the second and third sensors, this coil being electrically connected to the second and third measurement circuits, the longitudinal axis of this coil belonging to the second and third polygonal outlines.

The measurement circuits of the sensors are connected to a common electrical ground of the measurement device.

The device includes a holder, to which the coils are attached and being provided with electrically conductive tracks, the coils being electrically connected to one another by means of the tracks in order to form the measurement circuits.

The polygonal outlines take the shape of a quadrilateral, for example the shape of a square.

Each sensor includes four coils, the longitudinal axis of each coil of this sensor forming one side of the quadrilateral.

The polygonal outlines are contained in one and the same geometric plane that is substantially perpendicular to the electrical conductors.

Each coil includes a winding wound around a frame extending along the longitudinal axis of the coil, at least two coils of distinct sensors, the longitudinal axes of which are coincident, share one and the same frame extending along this axis, the respective windings of these coils being wound around this same frame.

At least one coil includes an end zone in which the inductance of the coil is higher with respect to the rest of the coil.

The coils of each sensor are arranged and connected to one another so as to exhibit complementary winding directions, i.e. arranged so as to turn in one and the same direction around the electrical conductor around which the corresponding sensor is placed.

The invention will be better understood and other advantages thereof will become more clearly apparent in the light of the following description of one embodiment of a measurement device provided solely by way of example and with reference to the appended drawings, in which:

FIG. 1 is a simplified schematic representation, in a front view, of a measurement assembly according to the prior art, including three Rogowski-type current sensors;

FIG. 2 is a schematic representation of an electrical circuit illustrating the connection of the current sensors of the assembly of FIG. 1;

FIG. 3 is a schematic representation, in perspective, of a current measurement device in accordance with one embodiment of the invention;

FIG. 4 is a simplified schematic representation, in a front view, of the device of FIG. 3;

FIG. 5 is a schematic representation of an electrical circuit showing the connection of the current sensors of the device of FIGS. 3 and 4;

Figure 7:
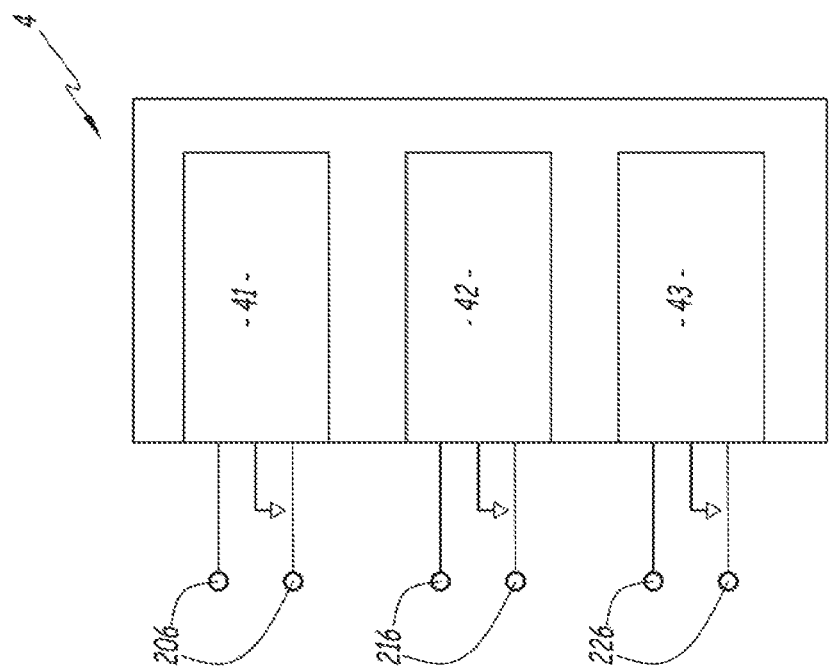
FIG. 7 is a schematic representation of a data processing unit connected to the current sensors of the measurement assembly of FIG. 2.

FIGS. 1 and 2 show an assembly 1 for measuring an AC electric current in electrical conductors 100, 110 and 120. For example, the conductors 100, 110 and 120 are electrical cables of a three-phase electrical system. Through each of the conductors 100, 110 and 120 flows an electric current that it is desired to measure. This current is for example an AC current, the phases of which are offset with respect to one another by an angle of 120°.

The assembly 1 includes three Rogowski-type current sensors 10, 11 and 12. The sensors 10, 11 and 12 are in this instance identical, such that only the sensor 10 is described in detail below.

The sensor 10 includes coils 101, 102, 103 and 104, which each extend along a rectilinear longitudinal axis, referenced X101, X102, X103 and X104, respectively.

In a known manner, each coil 101, 102, 103 and 104 includes a, preferably rigid, frame, which extends along the longitudinal axis of this coil X101, X102, X103 and X104. Each coil 101, 102, 103 and 104 also includes a winding, here of an electrically conductive wire, around the frame, between ends of this coil. The coils 101, 102, 103 and 104 are preferably pre-wound coils.

The coils 101, 102, 103 and 104 are positioned in one and the same geometric plane, in this instance perpendicular to the conductor 100, and are arranged with respect to one another such that their respective longitudinal axes X101, X102, X103 and X104 form a closed polygonal outline C10. These coils are joined to one another and delimit a central opening 105 of the sensor 10, through which the conductor 100 passes when the sensor 10 is in the assembled configuration. In this instance, the outline C10 is square in shape.

The respective windings of the coils 101, 102, 103 and 104 are electrically connected in series, so as to form a measurement circuit between the terminals 106 of the sensor 10, as illustrated in FIG. 2.

In this description, when two coils are said to be electrically connected to one another, it should be understood that it is their respective electrical windings that are electrically connected to one another.

In a known manner, when an electric current flows along the conductor 100, this generates a magnetic field around this conductor 100 and hence a magnetic flux at the level of each coil 101, 102, 103 and 104. In response, differences in electrical potential V1, V2, V3 and V4 arise between ends of the winding of each coil 101, 102, 103 and 104. Because the coils 101, 102, 103 and 104 are electrically connected in series, the differences in potential V1, V2, V3 and V4 add up between the terminals 106. The value of the electric current flowing through the conductor 100 is next determined according to the difference in electrical potential between the terminals 106. It is determined for example using a data processing unit, connected to the terminals 106. The operation of the sensors 11 and 12 is analogous to that of the sensor 10.

Such an assembly 1 does however exhibit drawbacks, in particular a substantial bulk when the conductors 100, 110 and 120 are close to one another.

To this end, FIGS. 3, 4 and 5 show a measurement device 2 according to the invention, for measuring an AC electric current in conductors 200, 210 and 220, respectively, which overcomes the aforementioned drawbacks.

The device 2 includes Rogowski-type current sensors 20, 21, 22 and a, preferably rigid, holder 3, to which the sensors 20, 21 and 22 are attached. Each sensor 20, 21, 22 is configured to measure an electric current flowing through the corresponding electrical conductor 200, 210, 220. The electrical conductors 200, 210, 220 are for example identical to the conductors 100, 110 and 120 and in this instance extend in parallel to one another.

The sensor 20 includes in this instance four coils 201, 202, 203 and 204. Each of these coils extends along a longitudinal axis, referenced X201, X202, X203 and X204, respectively. These coils 201, 202, 203 and 204 are joined to one another, in this instance at their ends, so as to delimit a central opening 205 of the sensor 20 through which the conductor 200 is received. The respective longitudinal axes X201, X202, X203 and X204 of the coils 201, 202, 203 and 204 form a closed polygonal outline C20 that surrounds the central opening 205. This outline C20 extends in a geometric plane to which the conductor 200 is substantially perpendicular when it is received through the central opening 205. Thus, when the sensor 20 and the device 2 are in the assembled configuration, the coils 201, 202, 203 and 204 surround the conductor 200.

In this example, the outline C20 is square in shape. In this instance, the coils 202 and 204 extend in parallel to one another. The coils 203 and 201 extend in parallel to one another perpendicularly to the coils 202 and 204. The longitudinal axis X201, X202, X203 and X204 of each coil of the sensor 20 forms one side of the outline C20.

As a variant, other shapes are possible, for example a shape of a quadrilateral or of a regular polyhedron. A quadrilateral will however be preferred, since it affords the device 2 better compactness. If other shapes are used, the number of coils in the sensor 20 is then adjusted correspondingly.

In this example, the longitudinal axis of each coil of the sensor 20 forms one side of the outline C20. As a variant, two adjacent coils of one and the same sensor may be aligned with one another and their axes may be coincident, such that one and the same side of the outline C20 corresponds to a plurality of coils of this sensor 20.

Each coil includes a frame extending along the geometric axis of this coil. Each coil also includes an electrical conductor wound around this frame between the ends of the coil. The coils are electrically connected to one another pairwise and in series. For example, the coils 201, 202, 203 and 204 are identical to the coils 101, 102, 103 and 104.

Advantageously, the coils 201, 202, 203 and 204 may include, at the level of an end zone 250, an increase in their inductance value. By way of nonlimiting example, the inductance of such a coil in the end zone 250 is 20% higher or, preferably, 50% higher than the inductance in the rest of this coil outside of this end zone 250. By way of example, the increase in the inductance value in the end zone 250 of a coil Is achieved by locally increasing the turn density of the winding of the conductive wire around the frame, for example by increasing the number of turns per unit length or else by increasing the number of turn layers. An exemplary implementation of such an inductance increase is described in EP 1 596 206 A1. This allows the measuring properties of the coil to be improved, so as to compensate for the effect of the magnetic discontinuity at the junctions between two adjacent coils of the sensor 20. This is particularly useful if the outline C20 takes the shape of a quadrilateral, since the turns located at the ends of the adjacent coils, for example the coils 201 and 204, are not contiguous.

In the present example, within the sensor 20, only the coils 201 and 203 include such end zones 250 in which the inductance is locally increased, as illustrated in FIG. 3.

In this illustrative example, the coils 201, 202, 203 and 204 are electrically connected in series between measurement terminals 206 in order to form a first measurement circuit of the sensor 20, as illustrated in FIG. 5. More specifically, in this instance, the coils 203 and 204 are electrically connected in series between one of the terminals 206 and a midpoint of the measurement circuit. This midpoint is connected to a common electrical ground 23, the role of which is described in greater detail below. Analogously, the coils 201 and 202 are connected in series between the other terminal 206 and this midpoint.

The terminals 206 are intended to be electrically connected to a data processing unit 4, which is configured to determine the value of the electric current flowing through the conductor 200 on the basis of the difference in electrical potential measured between these terminals 206.

In FIG. 4, the arrows W201, W202, W203 and W204 denote the winding direction of the coils 201, 202, 203 and 204, respectively. The term "winding direction of a coil", or "winding direction", in this instance refers to the direction in which the conductive wire forming this coil is wound around the frame when the coil is being manufactured. Specifically, this conductive wire is wound so as to form turns and exhibits, once wound around the frame, a trajectory in the shape of a circular helix.

Preferably, the coils of each sensor are arranged and connected to one another so as to exhibit complementary directions. Stated otherwise, the winding directions of the coils of one and the same sensor 20 are arranged so as to turn in one and the same direction around the electrical conductor 200 around which the corresponding sensor 20 is placed. For example, the winding directions of two adjacent coils are not positioned head to tail.

In this example, the coil 201 is wound starting from its end that is adjacent to the coil 204 and in the direction of its end that is adjacent to the coil 202. The coil 202 is wound starting from its end that is adjacent to the coil 201 and in the direction of its end that is adjacent to the coil 203, and so on for the coils 203 and 204.

In this illustrative example, the electric measurement current flows between the measurement terminals 206 in the same direction as the winding direction of the coils 201, 202, 203 and 204. In FIG. 4, the direction of this current is represented by the arrows drawn at the level of the measurement terminals 206. As a variant, the polarity of the measurement terminals 206 may be different, the direction in which the measurement current flows then being reversed.

The operation of the sensor 20 is analogous to that of the sensor 10 described above. More specifically, when an electric current flows along the electrical conductor 200, a magnetic flux arises along the axes X201, X202, X203 and X204 of the various coils 201, 202, 203 and 204, resulting in the occurrence of a difference in potential between the ends of the conductors of each of these coils. V1', V2', V3' and V4' denote the differences in electrical potential between the ends of the windings of the coils 201, 202, 203 and 204, respectively, as illustrated in FIG. 5. Preferably, it is recommended to connect the midpoint to the common electrical ground 23 so as to carry out differential electrical measurements.

In this example, the holder 3 advantageously includes electrically conductive tracks 31, for example formed on a face of the holder 3. By way of nonlimiting illustrative example, the holder 3 includes a board 30 made of epoxy resin or of plastic material, for example of PCB (printed circuit board) type. The tracks 31 are electrically conductive, for example made of metal, and in this instance are formed directly on a face of the board 30.

The coils 201, 202, 203 and 204 are in this instance attached to the holder 3. Their ends are connected to these tracks via connection pads borne by ends of these coils. The tracks 31 are preferably shaped so as to connect the coils of the sensor to one another as explained above.

As a variant, the tracks 31 are replaced with wires, which may be held on the holder 3.

The holder 3 is in this instance provided with pins 32 for the connection of the device 2. For example, a portion of the tracks 31 is linked to the pins 32 in order to connect them to the terminals 206. Thus, the device 2 can easily be connected to an item of equipment by inserting the pins into a corresponding connector. This is particularly useful for example for connecting the device 2 to an item of equipment including the data processing unit 4 mentioned above. As a variant, the data processing unit 4 is attached to the holder 3. The connectors 32 may also be used to supply electrical power to the data processing unit 4 when it is attached to the holder 3. The pins 32 may be omitted.

The sensors 21 and 22 operate analogously to the sensor 20.

The sensor 21 includes in this instance four coils 211, 213, 214 and the coil 204. The coils 211, 213 and 214 are for example identical to the coils 201, 203 and 204, respectively. The coils 211, 213, 214 and 204 are positioned with respect to one another such that their longitudinal axes (not illustrated) form a polygonal outline C21, analogous to the outline C20, and coplanar with the outline C20. In FIG. 4, for greater visibility, the coils 211 and 213 are illustrated as being separate from the other coils. However, in practice, such spacing is not desirable. In the device 2, the coils of the sensor 21 are adjacent to one another, as illustrated in FIG. 3.

The coils 211, 213, 214 and 204 are electrically connected in series between measurement terminals 216, in order to form a circuit for measuring the electric current of the sensor 21. These coils 211, 213, 214 and 204 define a central opening 215 of the sensor 21, analogous to the central opening 205, through which the conductor 210 is received. Thus, everything stated with reference to the sensor 20 applies to the sensor 21.

In this instance, the coil 204 is common to the sensor 20 and to the sensor 21. The coil 204 is furthermore electrically connected both to the first and to the second measurement circuits, as illustrated in FIG. 5. More specifically, the first and second measurement circuits are simultaneously connected to the common electrical ground 23. This common ground 23 is linked to a midpoint of the second measurement circuit, in the same way as that described with reference to the first measurement circuit.

The coils of the sensor 21 are connected analogously in the second measurement circuit to the coils of the sensor 20. For example, the coils 213 and 204 are connected in series between one of the terminals 216 and the midpoint of the second measurement circuit. The coils 211 and 214 are connected in series between the other terminal 216 of the second measurement circuit and this midpoint.

W211 denotes, in this instance, the winding direction of the coil 211 and W213 the winding direction of the coil 213. That which was described with reference to the winding direction of the coils of the sensor 20 also applies here.

Because the coil 204 is common to the sensors 20 and 21, the bulk of the device 2 is decreased, since it may be produced with one coil fewer than in the known assembly 1. With respect to the assembly of FIG. 1, one of the coils 104 or 112 is omitted. The device 2 thus exhibits a decreased bulk along with a lower production cost, since one fewer coil is needed to produce it.

The voltages measured between the terminals 206 of the first measurement circuit are substantially the same as those which would be measured at the terminals 106 of the measurement circuit of the known sensor 10. The same applies for the voltages measured at the terminals 216 of the second measurement circuit of the sensor 21 with respect to the sensor 11. Thus, one and the same data processing unit 4 may equally well be used with the device 2 or with an assembly 1 known from the prior art. In this way, the device 2 may be used in existing installations provided with a data processing unit, without it being necessary to reprogram this data processing unit.

In this example, the device 2 furthermore includes a sensor 22 for measuring the electric current flowing along the conductor 220. This sensor 22 operates analogously to the sensors 20 and 21. Thus, everything stated with reference to these sensors 20 and 21 applies here to the sensor 22.

The sensor 22 includes coils 221, 223, 224, for example identical to the coils 201, 203 and 204, and also includes the coil 214, which is shared with the sensor 21. This makes it possible, as above, to increase the compactness and decrease the bulk of the device 2. These coils 221, 223, 224 and 214 are positioned such that their longitudinal axes (not illustrated) form a polygonal outline C22, in this instance also coplanar with the outlines C20 and C21. Preferably, the outlines C20, C21 and C22 have the same dimensions and are identical to one another. The sensor 22 exhibits a central opening 225 delimited by the coils 221, 223, 224 and 214 and through which the conductor 220 is received when the device is in an assembled configuration.

The coils 221, 223, 224 and 214 of the sensor 22 are electrically connected in series so as to form a third measurement circuit of the sensor 22 between terminals 226. Everything described with reference to the terminals 206 also applies to the terminals 226.

The third measurement circuit is also electrically connected to the common electrical ground 23, in a manner analogous to that described with reference to the measurement circuit of the sensors 20 or 21, as illustrated in FIG. 5. For example, the common ground 23 is linked to a midpoint of the third measurement circuit, in the same way as that described with reference to the first measurement circuit. The coils of the sensor 22 are then connected in a manner analogous to that described with reference to the sensor 21. For example, the coils 223 and 214 are connected in series between one of the terminals 226 and the midpoint of the third measurement circuit and the coils 221 and 224 are connected in series between the other terminal 226 and this midpoint.

W221, W222, W223 and W224 denote, in this instance, the winding direction of the coils 221, 222, 223 and 224, respectively. That which was described with reference to the winding direction of the coils of the sensor 20 also applies here.

Advantageously, when the coils 201, 211 and 221 are aligned with one another and their respective longitudinal axes are coincident, these coils 201, 211 and 221 may share one and the same common frame. More specifically, the respective windings of these coils 201, 211 and 221 are wound around one and the same frame. This allows the compactness of the device 2 to be further increased. The same applies for the coils 203, 213 and 223.

As a variant, the device 2 includes a different number of sensors. For example, the device 2 includes only the sensors 20 and 21, such that the sensor 22 is omitted. This is for example useful when it is desired to measure the current in two electrical conductors only, for example in an electrical system where one of the conductors is a phase and the other of the conductors is a neutral associated with this phase.

According to another variant, all of the coils are identical to one another.

Figure 6:
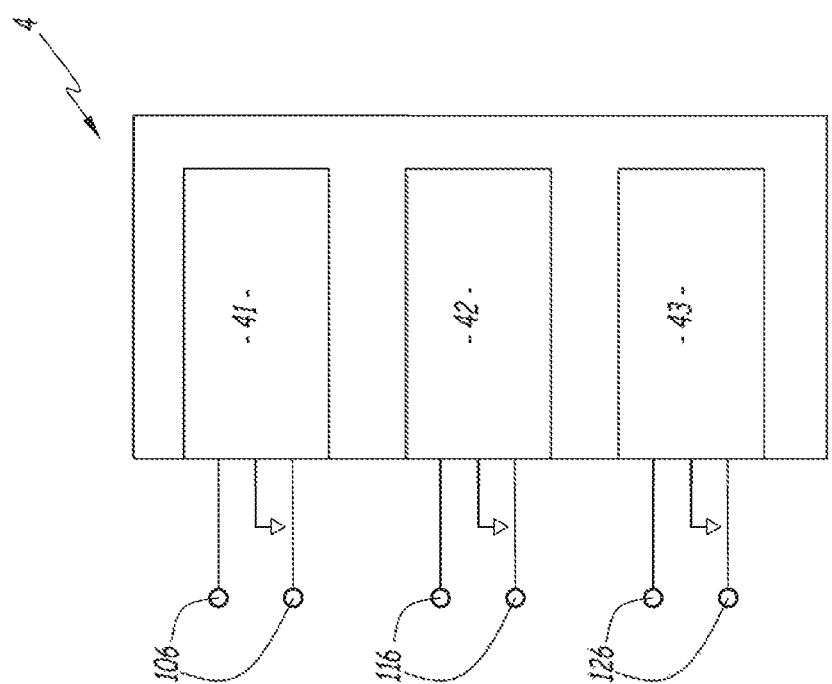
FIG. 6 is a schematic representation of a data processing unit connected to the current sensors of the measurement assembly of FIG. 1.

FIG. 6 schematically Illustrates the data processing unit 4 connected to the terminals 106, 116, 126 of the sensors 10, 11 and 12 of the assembly 1. More specifically, the data processing unit 4 includes three differential measurement circuits, referenced 41, 42 and 43. The circuits 41, 42 and 43 are connected to the terminals 106, 116 and 126, respectively, and to the common electrical ground.

FIG. 7 illustrates the same data processing unit 4, this time connected to the measurement terminals 206, 216 and 226 of the sensors 20, 21 and 22 of the measurement assembly 2. More specifically, the circuits 41, 42 and 43 are connected to the terminals 206, 216 and 226, respectively, and to the common electrical ground. Thus, the same data processing unit 4 may be reused as is for the purpose of being used with the measurement assembly 2 without it being necessary to transform the circuits 41, 42 and 43.

The embodiments and the variants contemplated above may be combined with one another so as to create new embodiments.

The invention claimed is:

1. A device for measuring electric currents, comprising:
   first and second Rogowski-type current sensors, each configured to measure an AC electric current in first and second electrical conductors,
   each of the first and second sensors including coils that are electrically connected in series to form first and second measurement circuits, respectively, each coil extending along a longitudinal axis,
   the coils of one and a same sensor being joined to one another to delimit a central zone of this sensor to receive the corresponding electrical conductor, the longitudinal axes of the coils of one and the same sensor forming a closed polygonal outline surrounding this central zone of this sensor,
   wherein one of the coils is common to the first and second sensors, the common coil being electrically connected to the first and second measurement circuits, the longitudinal axis of the common coil belonging to the first and second polygonal outlines.

2. The device as claimed in claim 1, further comprising:
   a third Rogowski-type current sensor configured to measure an electric current, in a third electrical conductor, the third sensor including coils that are electrically connected in series to form a fourth measurement circuit, the coils being joined to one another to delimit a central zone of the third sensor to receive the third electrical conductor, the respective longitudinal axes of the coils forming a third closed polygonal outline that surrounds the central zone of this sensor, one of the coils is common to the second and third sensors, the common coil being electrically connected to the second and third measurement circuits, the longitudinal axis of the common coil belonging to the second and third polygonal outlines.

3. The device as claimed in claim 1, wherein the measurement circuits of the sensors are connected to a common electrical ground of the measurement device.

4. The device as claimed in claim 1, further comprising a holder, to which the coils are attached and including electrically conductive tracks, the coils being electrically connected to one another by the tracks to form the measurement circuits.

5. The device as claimed in claim 1, wherein the polygonal outlines take a shape of a quadrilateral.

6. The device as claimed in claim 5, wherein each sensor includes four coils, the longitudinal axis of each coil of the sensor forming one side of the quadrilateral.

7. The device as claimed in claim 1, wherein the polygonal outlines are contained in one and same geometric plane that is substantially perpendicular to the electrical conductors.

8. The device as claimed in claim 7, wherein each coil includes a winding wound around a frame extending along the longitudinal axis of the coil, at least two coils of distinct sensors, the longitudinal axes of which are coincident, share one and same frame extending along this axis, respective windings of these coils being wound around the same frame.

9. The device as claimed in claim 1, wherein at least one coil includes an end zone in which inductance of the coil is higher with respect to the rest of the coil.

10. The device as claimed in claim 1, wherein the coils of each sensor are arranged and connected to one another to exhibit complementary winding directions, and arranged to turn in one and same direction around the electrical conductor around which the corresponding sensor is placed.

* * * * *